United States Patent [19]

Stoetzer

[11] Patent Number: 4,517,118

[45] Date of Patent: May 14, 1985

[54] NEW NICKEL COATING COMPOSITION FOR SHIELDING ELECTRONIC EQUIPMENT AND THE LIKE

[75] Inventor: Steven R. Stoetzer, Port Huron, Mich.

[73] Assignee: Acheson Industries, Inc., Port Huron, Mich.

[21] Appl. No.: 508,285

[22] Filed: Jun. 27, 1983

[51] Int. Cl.$^3$ .............................................. H01B 1/02
[52] U.S. Cl. .................................... 252/513; 252/512; 252/516; 524/440; 523/137
[58] Field of Search ............... 252/513, 516, 512, 518; 106/1.05, 290, 311; 524/440; 523/137

[56] References Cited

U.S. PATENT DOCUMENTS

| | | | |
|---|---|---|---|
| 3,484,284 | 12/1969 | Dates et al. | 252/513 |
| 3,709,835 | 1/1973 | Forster | 252/513 |
| 3,904,555 | 9/1975 | Matsuda et al. | 252/513 |
| 4,197,218 | 4/1980 | McKaveney | 252/513 |
| 4,390,458 | 6/1983 | McKaveney | 252/513 |

*Primary Examiner*—Josephine L. Barr
*Attorney, Agent, or Firm*—Harness, Dickey & Pierce

[57] ABSTRACT

A new nickel dispersion coating composition containing a special additional pigment material useful as a shielding coating to protect electronic equipment or the like from electromagnetic interference (EMI). The new coating composition is more economical to produce than prior coating compositions without significantly effecting performance characteristics.

16 Claims, No Drawings

NEW NICKEL COATING COMPOSITION FOR SHIELDING ELECTRONIC EQUIPMENT AND THE LIKE

BACKGROUND OF THE INVENTION

This invention relates to a new nickel coating composition to protect electronic equipment such as computers, video games or the like as well as cathode ray tubes, oscilloscope tubes or the like from electromagnetic interference (EMI). More particularly, this invention relates to a new nickel dispersion coating composition useable as a shielding coating that maintains high electrical conductivity even after exposure to elevated temperatures and humidity during operation. The new coating composition of this invention may be applied as a one-coat air dry system that is spray applied and needs no protective overcoat. It also, of course, may be applied by other means such as brushing, dipping, roller coating, or the like, and may also be overcoated with a decorative finish.

The state of its art is indicated by the following U.S. Pat. Nos. 3,968,056; 3,390,104; 3,920,452; 3,412,043; 2,280,135; 4,305,847; and 4,382,981.

It has generally been known that metal particles, such as copper, silver, gold platinum and the like, dispersed in a binder resin material or solution can be used to make an electrically conductive coating. However, all of these prior coatings have suffered from various deficiencies. Copper, for example, oxidizes during storage or use and the electrical properties of the coating are detrimentally effected. The use of silver, gold or platinum as the conductive material in sufficient quantity to insure good electrical conductivity greatly increases the cost of the electrically conductive coating.

The demands for conductive compositions are significantly increasing with increased emphasis on performance characteristics such as durability under harsh environmental changes; ability to use these compositions at increased temperatures; greater abrasion resistance and the like. At the same time, greater product capabilities and, perhaps more importantly, lower processing costs have been sought.

Accordingly, a main object of this invention is to provide a new coating composition containing finely divided nickel particles which is suitable for use in forming applied coatings having very good electrical conductance properties, and which composition is considerably more economical to produce than prior coatings having similar performance characteristics.

Another important object of this invention is to provide a new nickel coating composition which when applied as a coating maintains high electrical conductivity even after exposure to heat, humidity or other harsh environmental conditions.

Another object of the invention is to provide a new nickel coating composition that includes a special additional pigment component.

Another object of this invention is to provide an environmentally stable coating composition that is relatively economical to produce without significantly sacrificing electrical conductance properties of the coating composition.

A still further object of this invention is to provide a new coating composition capable of forming EMI shielding coatings on enclosures for electronic equipment.

An additional object of this invention is to provide a new composition with desirable magnetic properties.

Other objects, features and advantages of the present invention will become apparent from the subsequent description and the appended claims.

SUMMARY OF THE INVENTION

A significant purpose of this invention is to describe an electrically conductive coating composition containing nickel particles and a special additional pigment component which has highly useful electrical conductance properties and is considerably more economical to produce than prior coating compositions having similar performance characteristics. These new compositions retain highly useful electrical conductance properties after exposure to elevated temperatures for significant periods of time. By elevated temperatures is meant temperatures in the range of 200° F. and higher. In addition, the new coating composition exhibits generally excellent conductivity after exposure to significant variations in temperature. By significant variations in temperature is meant: 30 minutes at 160° F.; five minutes at room temperature; 30 minutes at −40° F.; and five minutes at room temperature.

The uses for these new coating compositions includes electromagnetic interference shielding; production of printed circuits by silk screening, and similar uses where a highly conductive film coating is needed.

These new coating compositions are typically applied to the interior and/or exterior surfaces of enclosures for electronic equipment to protect the contents of such enclosures from EMI. The coating compositions may also be applied as an EMI shielding coating directly onto the glass surface of cathode ray tubes, oscilloscope tubes or the like.

Numerous prior art deficiencies have been overcome through the discovery that if finely divided nickel particles are co-mixed with special refractory ferro alloys as described herein, the electrical conductance properties of the deposited film are maintained with very good characteristics, while the coating itself can be manufactured at a significantly reduced cost over prior coating compositions.

DESCRIPTION OF THE PREFERRED EMBODIMENTS

While it is not fully understood as to why the invention operates to provide such significantly useful electrically conductive nickel coatings, particularly in the area of EMI shielding coatings, the following preferred embodiments and preferred aspects of the invention will now be described.

The nickel pigment material used in the coating composition is substantially of nickel. The nickel pigment material broadly stated is finely divided nickel powder having an average particle size of less than about 10 microns and over about 99% purity. Preferably, the nickel powder used herein should be formed by the carbonyl process and have an average particle size of between about 2.0 microns and about 7.0 microns and 99+% in purity. Best results are obtained where the average particle size is between about 2.9 microns and about 3.6 microns. Such nickel pigment material broadly stated should have a surface area of approximately 0.25–0.75 $m^2$/gram and preferably of approximately 0.34–0.68 $m^2$/gram. Best results are obtained where the surface area of the nickel powder is approximately 0.58 $m^2$/gram. Small amounts of other conductive metals such as silver, copper and the like may also be present in amounts of about 2–3% or less by weight without substantially effecting performance characteristics. Nickel-plated glass beads, nickel-plated copper particles, nickel-plated ceramic particles and the like may also be used in this invention.

The additional pigment material used in the composition, which has been found to give very good properties to the coating is a refractory ferro alloy. Such ferro alloys include materials which are selected from at least one of the group consisting of ferrophosphorous, ferromanganese, ferromolybdenum, ferrosilicon, ferrochrome, ferrovanadium, ferrozirconium, ferrotitanium, ferrotungsten, ferroboron, and ferrocarbide or iron carbide. The ferro alloys discovered for use herein are described in U.S. Pat. No. 3,562,124, the disclosure of which is incorporated herein by reference.

Of the refractory ferro alloys indicated hereinabove, the preferred material is ferrophosphorous, and especially preferred is di-iron phosphide. The preferred ferrophosphorous refractory ferro alloy is an iron phosphide composition, generally containing from about 20 to 28% weight of phosphorous and corresponding to a mixture of $Fe_2P$ and $FeP$. The principal impurities occurring in ferrophosphorous are silicon, vanadium, chromium, nickel and manganese, as well as trace amounts of other elements. Of these, silicon and manganese are the major impurities, typically being present in amounts up to about 7% by weight. Ferrophosphorous is commercially available from the Hooker Chemicals and Plastics Corp. under the trademark Ferrophos® and is usually denominated di-iron phosphide.

The ferro alloy component of the present coating composition is a powder preferably having a random and angular particle shape. The particles of the ferro alloy constituent have an average particle size less than about 70 microns on a broad basis, and preferably less than about 30 microns. Best results are obtained where the average particle size is less than about 20 microns.

The ferro alloy used in this composition is present within the broad range of about 5% to about 90% by weight of the total pigment material in the composition. Preferably it is within the range of about 10% to about 50% by weight of the pigment material, and best results are obtained within the range of about 15% to about 35%.

The solvent carrier used with the coatings can be the conventional organic solvents or solvent blends useful for dissolving or dispersing the binder resin which will subsequently be described. The solvent used is one which is compatible with the binder resin, nickel particles, and ferro alloy particles. Also, because one use of the coating composition is to obtain an electromagnetic interference shield on the interior surfaces of plastic enclosed electronic devices, the solvent blend should be one which is compatible with the plastic containers and one which will not degrade the plastic materials. For example, with many solvent sensitive plastics, a blend of isopropanol and toluol has been found desirable. Broadly stated, solvents such as glycols, glycol ethers, esters, ketones, alcohols, acetates, etc., or water can be used as diluents. Generally suitable solvents are water, ketones, aromatics, alcohols, aliphatics or blends of same.

The binder resin used in the coating composition may be of any of a number of different materials. The binder resin may be a thermoplastic resin material which is compatible with the nickel particles and with the ferro alloy materials used in the coating composition. Thermosetting resin materials and silicates may also be used as the binder resin herein. The binder resin broadly stated is selected from at least one of the group consisting of thermoplastic acrylic, vinyl, urethane, alkyd, polyester, hydrocarbon, fluoroelastomer and cellulosic resins; and thermosetting acrylic, polyester, epoxy, phenolic, urethane, and alkyd resins. Vinyls, polyesters, and acrylics are preferred. The particular binder resin material chosen is dictated by the desired application method and which is also compatible with the substrate.

The pigment to binder ratio by weight in the coating composition of this invention should broadly be within the range between about 20 to 1 and about 2 to 1. Preferably it should be maintained in the range between about 10 to 1 and about 3 to 1.

Other materials which may also optionally be present in the coating composition are for example various thixotropic agents (anti-settling agents) selected from at least one of the group consisting of finely divided silicas, castor oil derivatives or organo-clays. Particularly suitable materials for this purpose are the bentonite clays.

When used, the thixotropic agent may be present in an amount of between about 0.1% and about 8% by weight of the total solids. Preferably, it should be within the range of about 0.1% to about 4% by weight of total solids and best results are obtained between about 1% and about 2%.

The percent total solids in the coating composition of the present invention should broadly be within the range of about 20% up to about 100% by weight. Preferably, it should be within the range of about 30% to about 85% and best results are obtained at about 60% to about 80% by weight.

The properties of the new coating composition as referred to herein are believed to be highly advantageous and unique. Broadly stated, the conductivity of the coating is within the range of about 0.2 to about 1000 ohms per square at 1 mil. On a preferred basis, the conductivity is within the range of about 0.5 to about 5 ohms per square at 1 mil, and particularly preferred embodiments exhibit conductivity of about 0.5 to about 3 ohms per square at 1 mil.

It has been found that the new coating compositions disclosed herein exhibit generally excellent abrasion resistance, adhesion, humidity resistance and heat resistance properties.

In order to further illustrate the invention, the following examples are provided. It is to be understood however that the examples are included for illustrative purposes and are not intended to be limiting of the scope of the invention as set forth in the subjoined claims.

EXAMPLE NO. 1*

*In all examples, all amounts are shown in parts by weight.

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Hooker Corp. Ferrophos ® 2131 | 5.9 |
| Di-Iron phosphide | |
| Nickel powder | 53.0 |
| Formulating procedure: | (1) Predissolve resin in mixed solvents |
| | (2) Add nickel powder and anti- |

-continued

|  |  |
|---|---|
|  | settling agent |
|  | (3) Disperse in a ball mill for seven hours |
|  | (4) Add Di-Iron phosphide and disperse for 15 minutes |
|  | (5) Unload |
| Standardized Application And Evaluation Procedure | (1) Sprayed on Lexan ® plastic sheets |
|  | (2) Air dried for 24 hours |
|  | (3) Resistance measured and standardized to 1 mil thickness |
| Results of 1 mil thick applied coating: | |
| Electrical resistance of 1.28 ohms per square at 1 mil. | |

Test coatings of examples 1 to 12 made by spraying on Lexan ® (registered trademark of General Electric Co.) plastic sheets and air drying for 24 hours.

EXAMPLE NO. 2

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Hooker Corp. Ferrophos ® 2131 | 11.8 |
| Di-Iron phosphide | |
| Nickel powder | 47.1 |
| Formulating procedure same as Example 1. | |
| Results for 1 mil thick applied coating: | |
| Electrical resistance of 1.77 ohms per square at 1 mil. | |

EXAMPLE NO. 3

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Hooker Corp. Ferrophos ® 2131 | 17.7 |
| Di-Iron phosphide | |
| Nickel powder | 41.2 |
| Formulating procedure same as Example 1. | |
| Results for 1 mil thick applied coating: | |
| Electrical resistance of 1.72 ohms per square at 1 mil. | |

EXAMPLE NO. 4

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured alcohol (solvent) | 1.6 |
| Toluol | 6.8 |
| n-Butyl Acetate | 13.0 |
| Hooker Corp. Ferrophos ® 2131 | 23.6 |
| Di-Iron phosphide | |
| Nickel powder | 35.3 |
| Formulating procedure same as Example 1. | |
| Results for 1 mil thick applied coating: | |
| Electrical resistance of 2.96 ohms per square at 1 mil. | |

EXAMPLE NO. 5

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Hooker Corp. Ferrophos ® 2131 | 29.5 |
| Di-Iron Phosphide | |
| Nickel powder | 29.5 |
| Formulating procedure same as Example 1. | |
| Results for 1 mil thick applied coating: | |
| Electrical resistance of 4.42 ohms per square at 1 mil. | |

EXAMPLE NO. 6

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Nickel powder | 44.2 |
| Iron Carbide | 14.7 |
| Formulating procedure same as Example 1. | |
| Results for 1 mil thick applied coating: | |
| Electrical resistance of 1.42 ohms per square at 1 mil. | |

EXAMPLE NO. 7

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Nickel powder | 44.2 |
| Ferrotitanium | 14.7 |
| Formulating procedure same as Example 1. | |
| Results for 1 mil thick applied coating: | |
| Electrical resistance of 1.17 ohms per square at 1 mil. | |

EXAMPLE NO. 8

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Hooker Corp. Ferrophos ® 2131 | 14.7 |
| Di-Iron phosphide | |
| Nickel powder | 44.2 |
| Formulating procedure same as Example 1. | |
| Results for 1 mil thick applied coating: | |
| Electrical resistance of 1.19 ohms per square at 1 mil. | |

EXAMPLE NO. 9

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |

-continued

| | |
|---|---|
| Nickel powder | 44.2 |
| Ferroboron | 14.7 |

Formulating procedure same as Example 1.
Results for 1 mil thick applied coating:
Electrical resistance of 1.34 ohms per square at 1 mil.

EXAMPLE NO. 10

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Nickel powder | 44.2 |
| Ferrovanadium | 14.7 |

Formulating procedure same as Example 1.
Results for 1 mil thick applied coating:
Electrical resistance of 1.51 ohms per square at 1 mil.

EXAMPLE NO. 11

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Nickel powder | 44.2 |
| Ferromanganese | 14.7 |

Formulating procedure same as Example 1.
Results for 1 mil thick applied coating:
Electrical resistance of 1.11 ohms per square at 1 mil.

EXAMPLE NO. 12

| | |
|---|---|
| Methyl methacrylate polymer (binder resin) | 9.8 |
| Castor oil derivative (anti-settling agent) | 2.0 |
| Ethylene glycol monoethyl ether (solvent) | 7.9 |
| Denatured ethyl alcohol (solvent) | 1.6 |
| Toluol | 6.8 |
| n-Butyl Acetate | 13.0 |
| Nickel powder | 44.2 |
| Ferrotungsten | 14.7 |

Formulating procedure same as Example 1.
Results for 1 mil thick applied coating:
Electrical resistance of .942 ohms per square at 1 mil.

EXAMPLE NO. 13

| | |
|---|---|
| Methyl butyl methacrylate copolymer (binder resin) | 5.5 |
| Bentonite Clay Bentone ® 27 | 0.6 |
| Nickel powder | 35.4 |
| Ferromanganese | 8.8 |
| n-Butanol | 4.2 |
| n-Propyl Acetate | 32.4 |
| Isopropanol | 1.4 |
| Toluol | 11.7 |

Formulating procedure:
(1) Predissolve binder resin in mixed solvents
(2) Add dissolved resin, nickel powder and clay
(3) Load all ingredients into shot mill and mix for 15 minutes Results for 1 mil thick applied coating:
Electrical resistance of 1.32 ohms per square at mil.

Test coatings for Examples 13, 14, 16, 17, 19, 21 and 22 made by spraying on Lexan ® sheets and air drying for 72 hours.

EXAMPLE NO. 14

| | |
|---|---|
| Union Carbide Corp. VROH Vinyl Terpolymer Resin | 6.9 |
| n-Butanol | 5.1 |
| n-Propyl Acetate | 40.3 |
| Isopropanol | 1.8 |
| Toluol | 14.6 |
| Fumed Colloidal Silica (Cabosil M-5) | 0.4 |
| Nickel powder | 24.0 |
| Iron Carbide | 6.9 |

Formulating procedure as in Example 13.
Results for 1 mil thick applied coating:
Electrical resistance of 1.97 ohms per square at 1 mil.

EXAMPLE NO. 15

| | |
|---|---|
| Rohm and Haas Co. Acryloid ® AT-50 Thermosetting Acrylic polymer (binder resin) | 11.8 |
| Ethylene glycol monoethyl ether acetate (solvent) | 11.7 |
| Methyl Ethyl Ketone (solvent) | 35.3 |
| Nickel powder | 29.4 |
| Ferrotitanium | 11.8 |

Formulating procedure as in Example 13.
Results for 1 mil thick applied coating:
Electrical resistance of 20.8 ohms per square at 1 mil.

Test coating for Examples 15 and 20 made by spraying on glass plate and curing for 30 minutes at 325° F.

EXAMPLE NO. 16

| | |
|---|---|
| Shell Chemical Co. EPON ® 1007 epoxy resin | 7.1 |
| Methyl Ethyl Ketone | 28.5 |
| Toluol | 28.5 |
| Nickel powder | 21.3 |
| Ferrovanadium | 14.2 |

Formulating procedure as in Example 13.
Before coating, add Shell Chemical Co. EPON ® H-3 curing agent  0.4
Results for 1 mil thick applied coating:
Electrical resistance of 5.59 ohms per square at 1 mil.

EXAMPLE NO. 17

| | |
|---|---|
| Mobay Chemical Corp. MULTRON R-221-75 saturated polyester resin | 11.4 |
| Ethylene glycol monoethyl ether acetate | 22.7 |
| Butyl Acetate | 11.3 |
| Nickel powder | 31.8 |
| Ferroboron | 11.4 |

Formulating procedure as in Example 13.
Before coating, add Mobay Chemical Corp. DESMODUR IL polyisocyanate  11.4
Results for 1 mil thick applied coating:
Electrical resistance of 3.04 ohms per square at

EXAMPLE NO. 18

| | |
|---|---|
| KASIL #1 (Aqueous Potassium Silicate solution) | 34.8 |
| Nickel powder | 35.6 |
| Hooker Corp. Ferrophos ® 2131 | 23.8 |
| Di-Iron Phosphide | |
| Deionized water | 5.8 |

Formulating procedure as in Example 13.
Test coating after spraying on glass plates and curing for 30 minutes at 200° F.
Results for 1 mil thick applied coating:
Electrical resistance of 6.64 ohms per square at 1 mil.
Test coating after spraying on glass plates and curing for 15 minutes at 1000° F.
Results for 1 mil thick applied coating:
Electrical resistance of 2.72 ohms per square at 1 mil.

EXAMPLE NO. 19

| | |
|---|---|
| Mobay Chemical Corp. MULTRON R-221-75 | 11.4 |
| Saturated Polyester Resin | |
| Nickel powder | 31.8 |
| Hooker Corp. Ferrophos ® 2131 | 11.4 |
| Di-Iron Phosphide | |
| Ethylene Glycol Monoethyl Ether Acetate | 22.7 |
| Butyl Acetate | 11.3 |
| Formulating procedure same as in Example 13. | |
| Before coating, add Mobay Chemical Corp. DESMODUR IL Polyisocyanate | 11.4 |

Results for 1 mil thick applied coating:
Electrical resistance of 2.06 ohms per square at 1 mil.

EXAMPLE NO. 20

| | |
|---|---|
| Rohm and Haas Co. Acryloid ® AT-50 | 11.8 |
| Thermosetting Acrylic Polymer | |
| Ethylene Glycol Monoethyl Ether Acetate | 11.7 |
| Methyl Ethyl Ketone | 35.3 |
| Nickel Powder | 30.0 |
| Hooker Corp. Ferrophos ® 2131 | 15.0 |
| Di-Iron Phosphide | |

Formulating procedure same as in Example 13.
Results for 1 mil thick applied coating:
Electrical resistance of 20.4 ohms per square at 1 mil.

EXAMPLE NO. 21

| | |
|---|---|
| Methyl Butyl Methacrylate Copolymer | 5.5 |
| n-Butanol | 4.2 |
| Toluol | 11.7 |
| n-Propyl Acetate | 32.4 |
| Isopropanol | 1.4 |
| Bentonite Clay Bentone ® 27 | 0.6 |
| Nickel Powder | 36.0 |
| Hooker Corp. Ferrophos ® 2131 | 9.0 |
| Di-Iron Phosphide | |

Formulating procedure same as in Example 13.
Results for 1 mil thick applied coating:
Electrical resistance of 1.5 ohms per square at 1 mil.

EXAMPLE NO. 22

| | |
|---|---|
| Union Carbide Corp. VROH | 6.9 |
| Vinyl Terpolymer Resin | |
| n-Butanol | 5.1 |
| Toluol | 14.6 |
| n-Propyl Acetate | 40.3 |
| Isopropanol | 1.8 |
| Fumed Colloidal Silica (Cabosil M-5) | 0.5 |
| Nickel powder | 25.0 |
| Hooker Corp. Ferrophos ® 2131 | 7.0 |
| Di-Iron Phosphide | |

Formulating procedure same as in Example 13.
Results for 1 mil thick applied coating:
Electrical resistance of 1.55 ohms per square at 1 mil.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

I claim:

1. A new nickel-containing composition which is liquid when applied to a substrate, and forms a shielding coating on the substrate, said composition being comprised of:
   (a) a nickel pigment material, said pigment being finely particulated and having an average particle size of about 10 microns or less,
   (b) a ferro alloy pigment material which is selected from at least one of the group consisting of ferrophosphorous, ferromanganese, ferromolybdenum, ferrosilicon, ferrochrome, ferrovanadium, ferrozirconium, ferrotitanium, ferrotungsten, ferroboron and ferrocarbide,
      said ferro alloy pigment material is present in amount of about 5% to about 90% by weight of the total solids, said ferro alloy pigment material has an average particle size of less than about 70 microns,
   (c) a binder resin which is selected from at least one of the group consisting of aqueous silicate solutions, thermoplastic acrylic, vinyl, urethane, alkyd, polyester, hydrocarbon, fluoroelastomer and cellulosic resins, and thermosetting acrylic, polyester, epoxy, phenolic, urethane and alkyd resins,
   (d) the pigment to binder weight ratio in said composition being between about 10 to 1 and about 3 to 1, and
   (e) said composition containing a weight percent total solids from about 30% to about 85%, and a solvent carrier for the composition being used as required.

2. The composition of claim 1 further characterized in that said ferro alloy pigment material is di-iron phosphide.

3. The composition of claim 1 further characterized in that said ferro alloy pigment material is present in amount of about 10% to about 50% by weight of the total solids.

4. The composition of claim 1 further characterized in that said ferro alloy pigment material is present in amount of about 15% to about 35% by weight of the total solids.

5. The composition of claim 1 further characterized in that said composition additionally contains a thixotropic agent selected from at least one of the group consisting of finely divided silicas, hydrated silicates, castor oil derivatives or organoclays, said thixotropic agent being present between about 0.1% and about 8% by weight of the total solids.

6. The composition of claim 1 further characterized in that said composition additionally contains a thixotropic agent selected from at least one of the group consisting of finely divided silicas, hydrated silicates, castor oil derivatives or organoclays, said thixotropic agent being present between about 0.1% and about 4% by weight of the total solids.

7. The composition of claim 1 further characterized in that said binder resin is a thermoplastic resin.

8. The composition of claim 1 further characterized in that said binder resin is a thermoplastic acrylic resin.

9. The composition of claim 1 further characterized in that said composition enables the coating as applied to maintain an electrical conductivity between about 0.2 to about 1000 ohms per square at 1 mil.

10. The composition of claim 1 further characterized in that said composition enables the coating composition as applied to maintain an electrical conductivity between about 0.5 to about 5 ohms per square at 1 mil.

11. The composition of claim 1 further characterized in that said composition enables the coating composition as applied to maintain an electrical conductivity between about 0.5 to about 3 ohms per square at 1 mil.

12. The composition of claim 1 further characterized in that said ferro alloy pigment material is present in amount of about 10% to about 50% by weight of the total solids and said pigment to binder weight ratio in said composition is between about 10 to 1 and about 3 to 1 and said composition enables the coating as applied to maintain an electrical conductivity between about 0.5 to about 5 ohms per square at 1 mil.

13. The composition of claim 12 further characterized in that said composition enables the coating as applied to maintain an electrical conductivity between about 0.5 and about 3 ohms per square at 1 mil.

14. The composition of claim 12 further characterized in that said weight percent total solids in said composition is between about 60% and about 80%.

15. The composition of claim 1 further characterized in that said composition additionally contains a thixotropic agent selected from at least one of the group consisting of finely divided silicas, hydrated silicates, castor oil derivatives or organoclays, said thixotropic agent being present between about 0.1% and about 4% by weight of the total solids.

16. The composition of claim 12 further characterized in that said composition additionally contains a thixotropic agent selected from at least one of the group consisting of finely divided silicas, hydrated silicates, castor oil derivatives or organoclays, said thixotropic agent being present between about 1% and about 2% by weight of the total solids.

* * * * *